(12) United States Patent
Speck et al.

(10) Patent No.: US 8,536,014 B2
(45) Date of Patent: Sep. 17, 2013

(54) SELF ALIGNED SILICIDE DEVICE FABRICATION

(75) Inventors: Robert K. Speck, Kokomo, IN (US); Kenneth B. Tull, Carmel, IN (US); Marjorie L. Miller, Marion, IN (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 13/306,494

(22) Filed: Nov. 29, 2011

(65) Prior Publication Data
US 2013/0134558 A1   May 30, 2013

(51) Int. Cl.
*H01L 21/20* (2006.01)
(52) U.S. Cl.
USPC .......................... 438/381; 438/595; 438/792

(58) Field of Classification Search
USPC ................ 438/595, 790–792, 381; 257/337, 257/382, 384, 388
See application file for complete search history.

(56) References Cited

U.S. PATENT DOCUMENTS

| | | | |
|---|---|---|---|
| 5,459,087 A * | 10/1995 | Mochizuki | 438/575 |
| 6,359,339 B1 * | 3/2002 | Gregor et al. | 257/757 |
| 2004/0175924 A1 * | 9/2004 | Choi et al. | 438/622 |
| 2005/0212082 A1 * | 9/2005 | Takeda et al. | 257/534 |

* cited by examiner

*Primary Examiner* — Dung A. Le
(74) *Attorney, Agent, or Firm* — Cantor Colburn LLP

(57) ABSTRACT

A method for fabricating a device includes forming a silicide layer on a substrate, forming a conductive layer over exposed portions of the substrate and the silicide layer, patterning and removing exposed portions of the conductive layer and the silicide layer with a first process, and patterning and removing exposed portions of the conductive layer with a second process.

14 Claims, 8 Drawing Sheets

SELF ALIGNED SILICIDE DEVICE FABRICATION

FIELD OF THE INVENTION

The subject invention relates to resistor features formed on substrates.

BACKGROUND

Metallic silicide materials such as, for example, Chrome Silicide (CrSi) is often used as a thin film resistor in integrated circuit designs. The silicide may be fabricated with sheet resistances that range from approximately 100 ohm/sq to greater than 100 Kohm/sq (for CrSi features). Such resistors may be processed to exhibit low temperature coefficients of resistance.

Previous methods for fabricating metallic silicide features typically used photolithographic masking and etching processes to pattern the silicide at the silicide process level.

SUMMARY OF THE INVENTION

In one exemplary embodiment of the invention, a method for fabricating a device includes forming a silicide layer on a substrate, forming a conductive layer over exposed portions of the substrate and the silicide layer, patterning and removing exposed portions of the conductive layer and the silicide layer with a first process, and patterning and removing exposed portions of the conductive layer with a second process.

In another exemplary embodiment of the invention, a method for fabricating a device includes forming a silicide layer on a substrate, forming a conductive layer over exposed portions of the silicide layer, patterning a first mask material over a portion of the conductive layer, removing exposed portions of the conductive layer and the silicide layer with a first process, removing the first mask material, patterning a second mask material over a portion of the conductive layer, and removing exposed portions of the conductive layer with a second process.

In yet another exemplary embodiment of the invention, a resistive device includes a silicide layer disposed on a substrate, a first conductive contact arranged at a first distal end of the silicide layer, and a second conductive contact arranged at a second distal end of the silicide layer.

The above features and advantages and other features and advantages of the invention are readily apparent from the following detailed description of the invention when taken in connection with the accompanying drawings.

BRIEF DESCRIPTION OF THE DRAWINGS

Other features, advantages and details appear, by way of example only, in the following detailed description of embodiments, the detailed description referring to the drawings in which.

DESCRIPTION OF THE EMBODIMENTS

Figure 1:
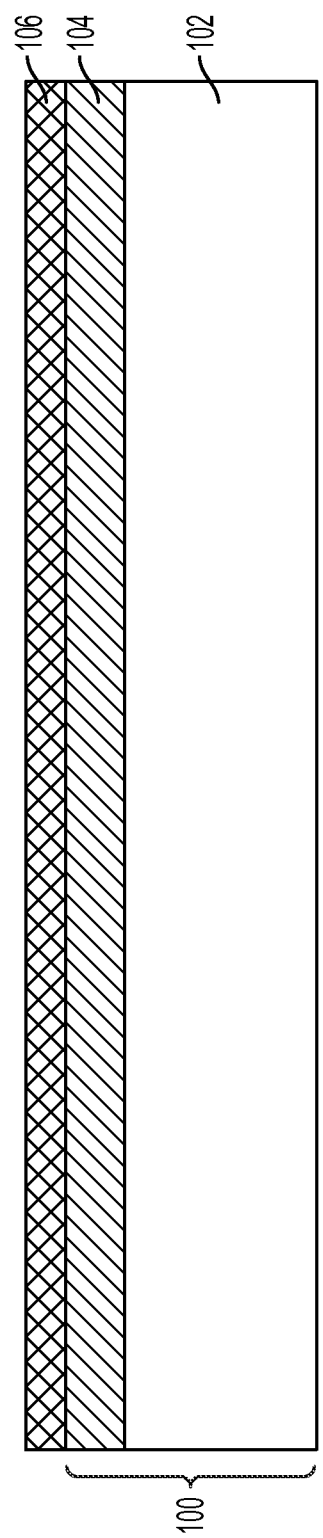
FIG. 1 illustrates a side cut-away view of a substrate with a silicide layer.

The following description is merely exemplary in nature and is not intended to limit the present disclosure, its application or uses. It should be understood that throughout the drawings, corresponding reference numerals indicate like or corresponding parts and features.

Though metallic silicide features such as, for example, resistors exhibit desirable resistive properties, the use of thin film to fabricate the features is often difficult. Previous methods for fabricating metallic silicide features that typically used wet etching for the metal conduction layer that follows, are therefore limited to the larger geometries associated with wet etching. Previous methods for fabricating metallic silicide features that used dry etching for the metal conduction layer that follows, typically included an additional dielectric layer, special silicide contact mask, and wet etch to protect the silicide film from attack during the dry etching process and to make contact with the silicide layer. Previous methods for fabricating metallic silicide features typically used additional substrate area to account for alignment error between the silicide layer and the metal conduction layer. Often when a plasma etching process was used, however fabrication processes included, for example, additional costs due to dielectric deposition and masking steps that protected portions of the film during the dry etching process. Such processes often resulted in resistive features consuming a greater area of a substrate than desired.

In accordance with an exemplary embodiment of the invention an exemplary method for fabricating a silicide resistor feature is described below in FIGS. 1-8. FIG. 1 illustrates a side cut-away view of a substrate 100 that includes a semiconductor layer 102 that may include, for example, a silicon or germanium material, and an insulator layer 104, that may include, for example, a buried oxide (BOX) layer disposed on the semiconductor layer 102. A silicide layer 106 such as for example CrSi, is disposed over the insulator layer 104 using, for example, a sputtering system or PVD process followed by an annealing process. In the illustrated embodiment, the silicide layer 106 is approximately 300 angstroms in thickness.

Figure 2:
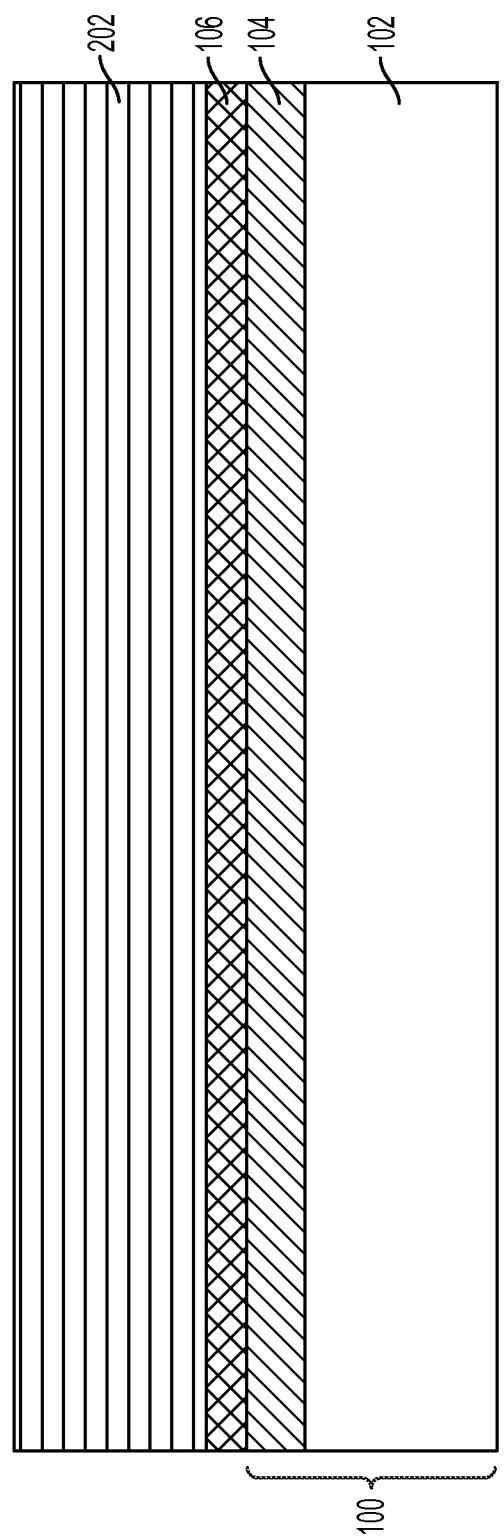
FIG. 2 illustrates the formation of a conductive layer.

FIG. 2 illustrates the formation of a conductive layer 202 over exposed portions of the silicide layer 106 and the substrate 100. The conductive layer 202 may include any suitable conductive material or combination with barrier metals including such as, for example, Al, AlSi, AlCuSi, AlCu, Ag, and Au. The conductive layer 202 may be deposited using, for example, evaporators, sputtering systems, or PVD processes. The conductive layer 202 of the illustrated embodiment is approximately 9000 angstroms thick and may range between 6000 A to 40000 A. Though the illustrated embodiment shows the conductive layer 202 disposed over the silicide layer 106, the conductive layer 202 may also be formed over exposed portions of the substrate 100 or features arranged on the substrate 100 such as active or passive devices or portions of active or passive devices. For example, the conductive layer 202 material may fill conductive vias or cavities arranged on the substrate 100 or may be used to form other features.

Figure 3:
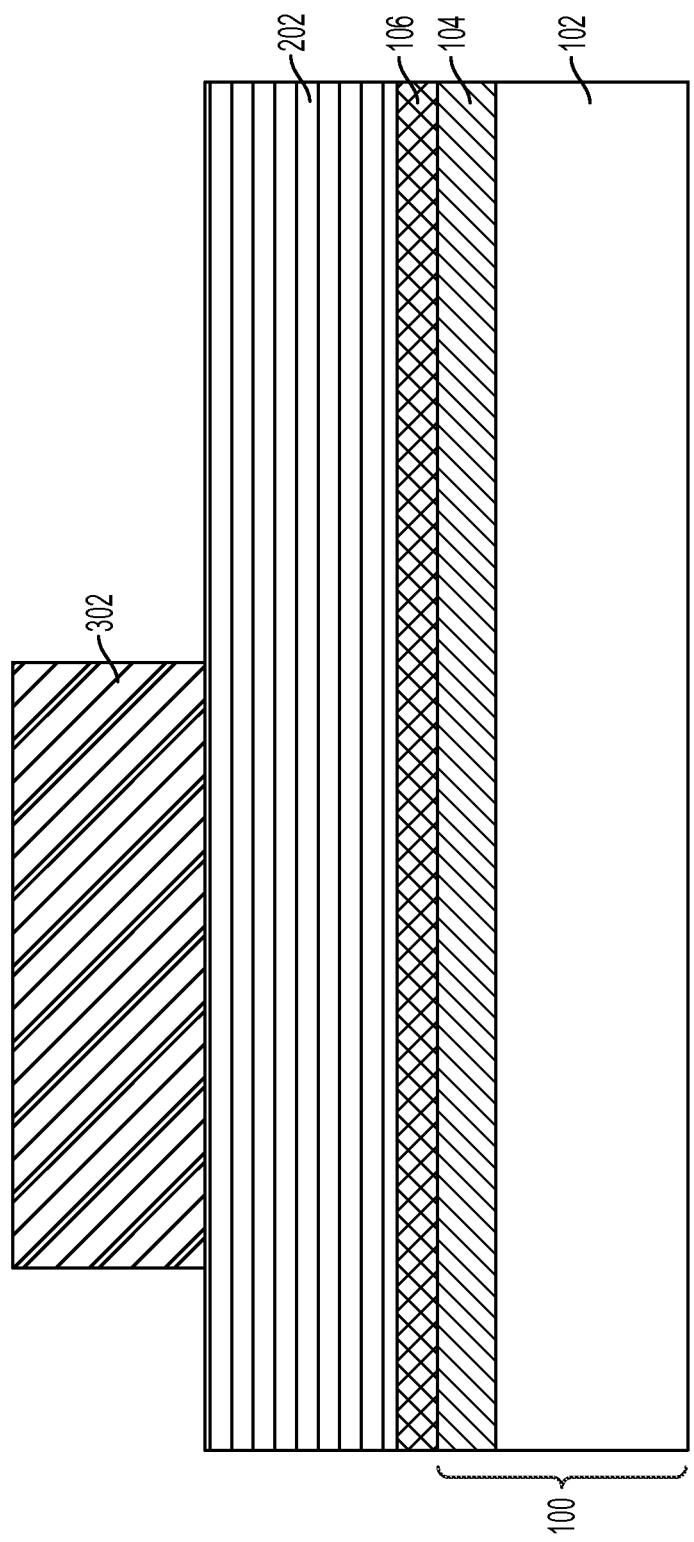
FIG. 3 illustrates the patterning of a photolithographic mask material.

FIG. 3 illustrates a photolithographic mask material 302 that has been patterned over a portion of the conductive layer 202. The photolithographic mask material 302 may be deposited and patterned using any suitable photolithographic process.

Figure 4:
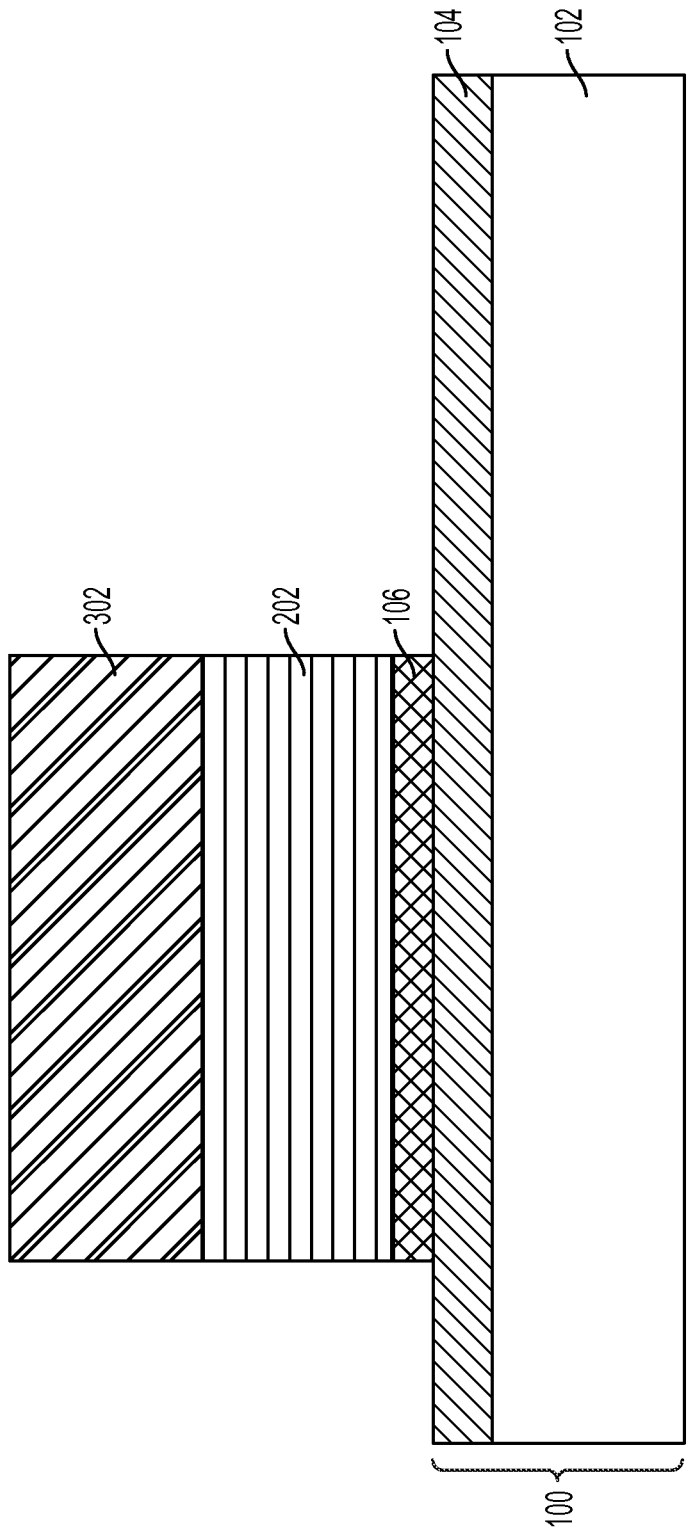
FIG. 4 illustrates the removal of exposed portions of the conductive layer and silicide layer.

FIG. 4 illustrates the removal of exposed portions of the conductive layer 202 and the silicide layer 106 using, for example, an anisotropic etching process such as, a plasma etching process. The etching process removes the exposed portions of the conductive layer 202, and also removes portions of the silicide layer 106, if such portions are not aligned with the mask material 302. The removal of portions of the conductive layer 202 to define a resistive device (described below), may expose features or devices arranged on the substrate 100 that were obscured by the conductive layer 202 during the deposition of the conductive layer 202 (as described above). Though the illustrated embodiment of the mask material 302 partially defines a resistive device (described below), the mask material 302 may also be used to pattern other features on the substrate that may be defined by the subsequent removal of exposed portions of the conductive layer using the processes described above. Thus, the conductive layer 202 and subsequent patterning and removal of portions of the conducive layer 202 may effectively be used to partially define or fabricate the resistive device and other features (not shown) that may be arranged on the substrate 100.

Figure 5:
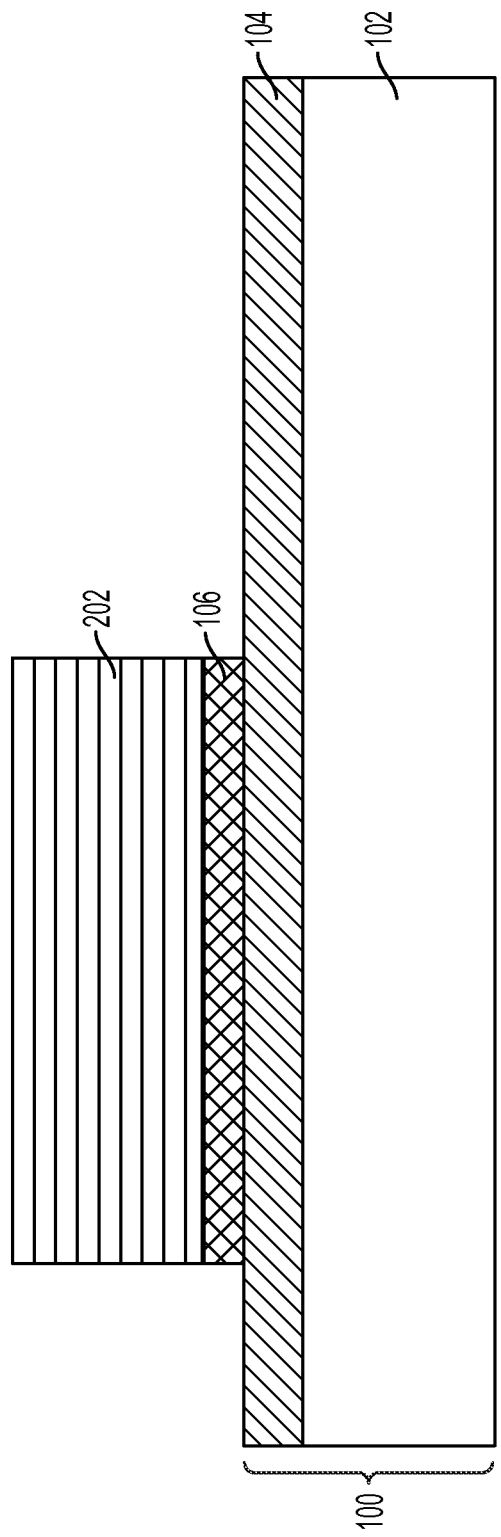
FIG. 5 illustrates the resultant structure following removal of the photolithographic mask material.
Figure 6:
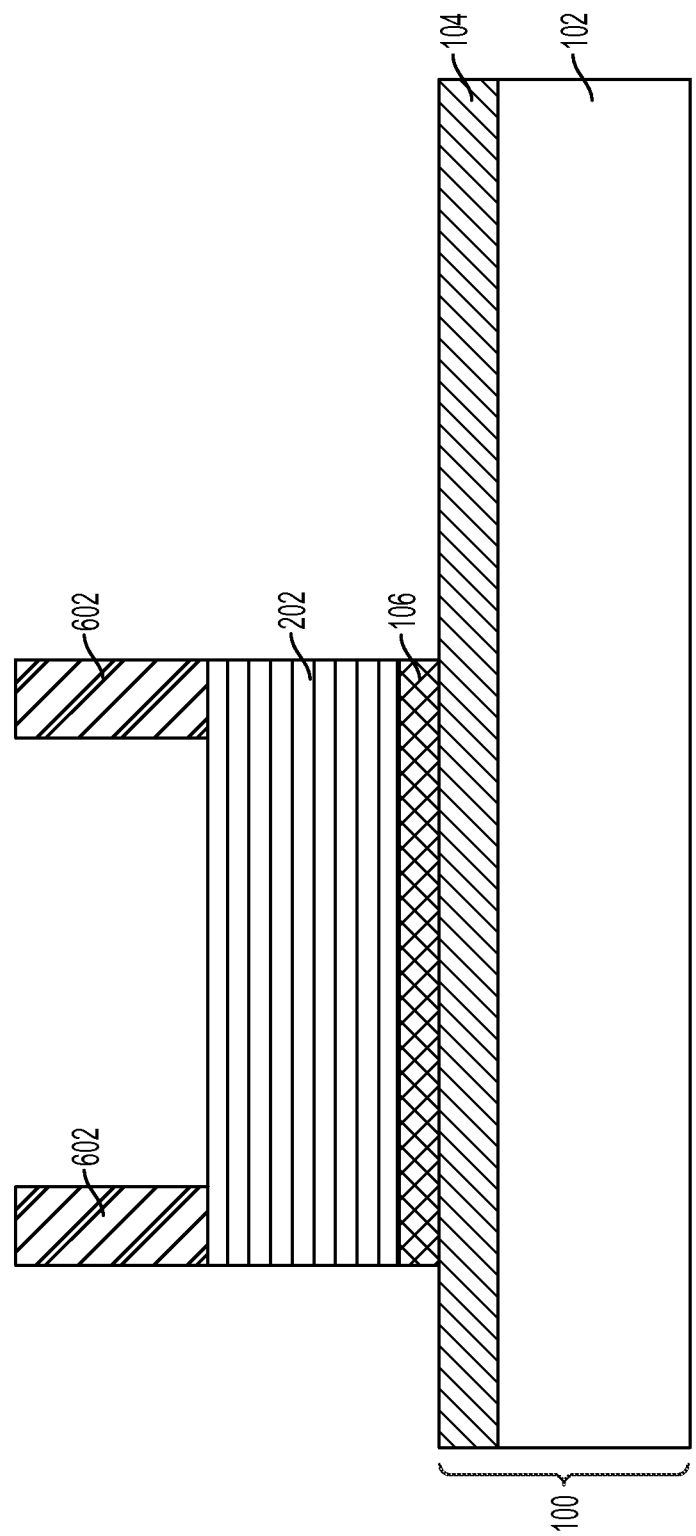
FIG. 6 illustrates the patterning a photolithographic mask material.

FIG. 5 illustrates the resultant structure following removal of the mask material 302, which exposes the conductive layer 202. Once the mask material 302 is removed another photolithographic mask material 602 is patterned on portions of the conductive layer 202 using a suitable photolithographic patterning process as shown in FIG. 6.

Figure 7:
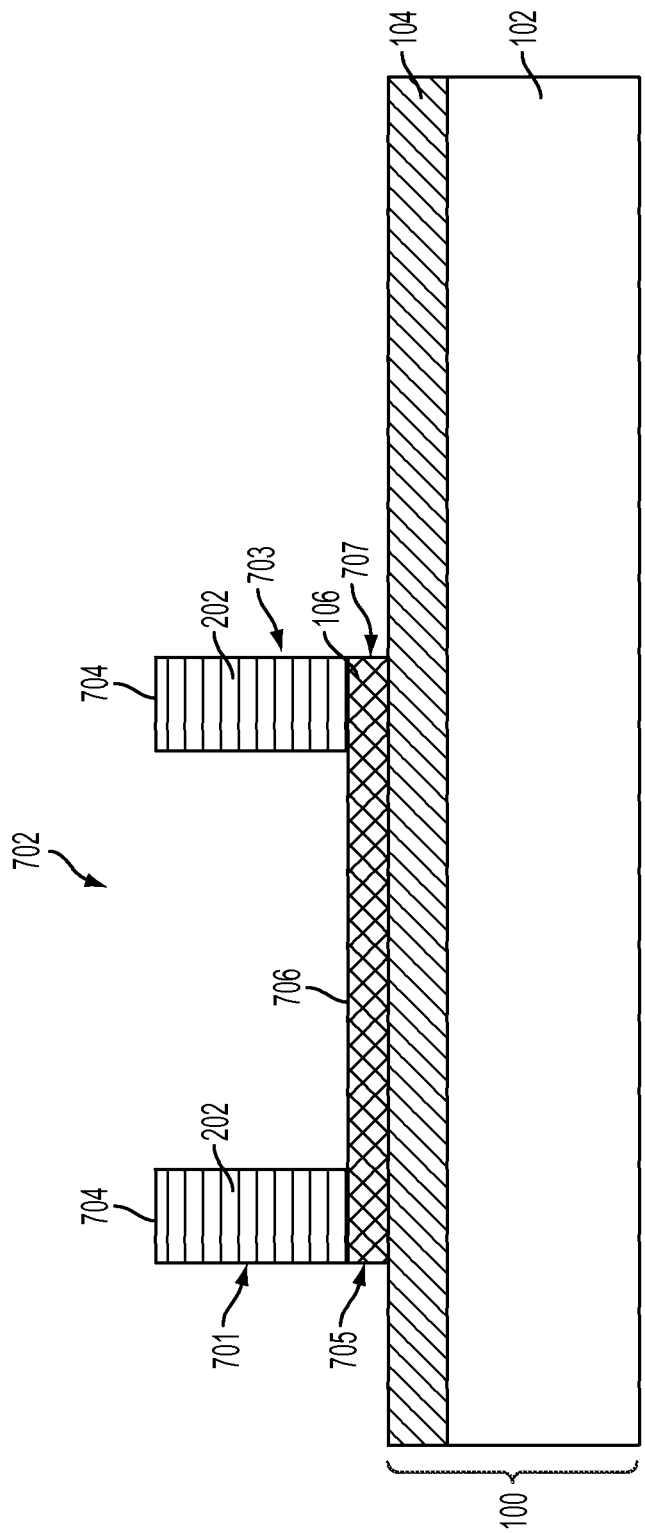
FIG. 7 illustrates an exemplary embodiment of a resistive device.

FIG. 7 illustrates the resultant structure following the removal of exposed portions of the conductive layer 202, and then the removal of the mask material 602. The exposed portions of the conductive layer 202 are removed using a wet etching process or chemical etching process, which is substantially selective to the conductive layer 202 such that the wet etching process does not remove appreciable amounts of the silicide layer 106 or the substrate 100. Following the wet etching process, the mask material 602 may be removed.

In this regard, FIG. 7 illustrates an exemplary embodiment of a resistive device 702 that includes conductive contact portions 704 arranged at distal ends of a resistive body portion 706. The conductive contact portions 704 each have surfaces 701 and 703 that are arranged substantially coplanar with surfaces 705 and 707, respectively, at the distal ends of the resistive body portion 706.

Figure 8:
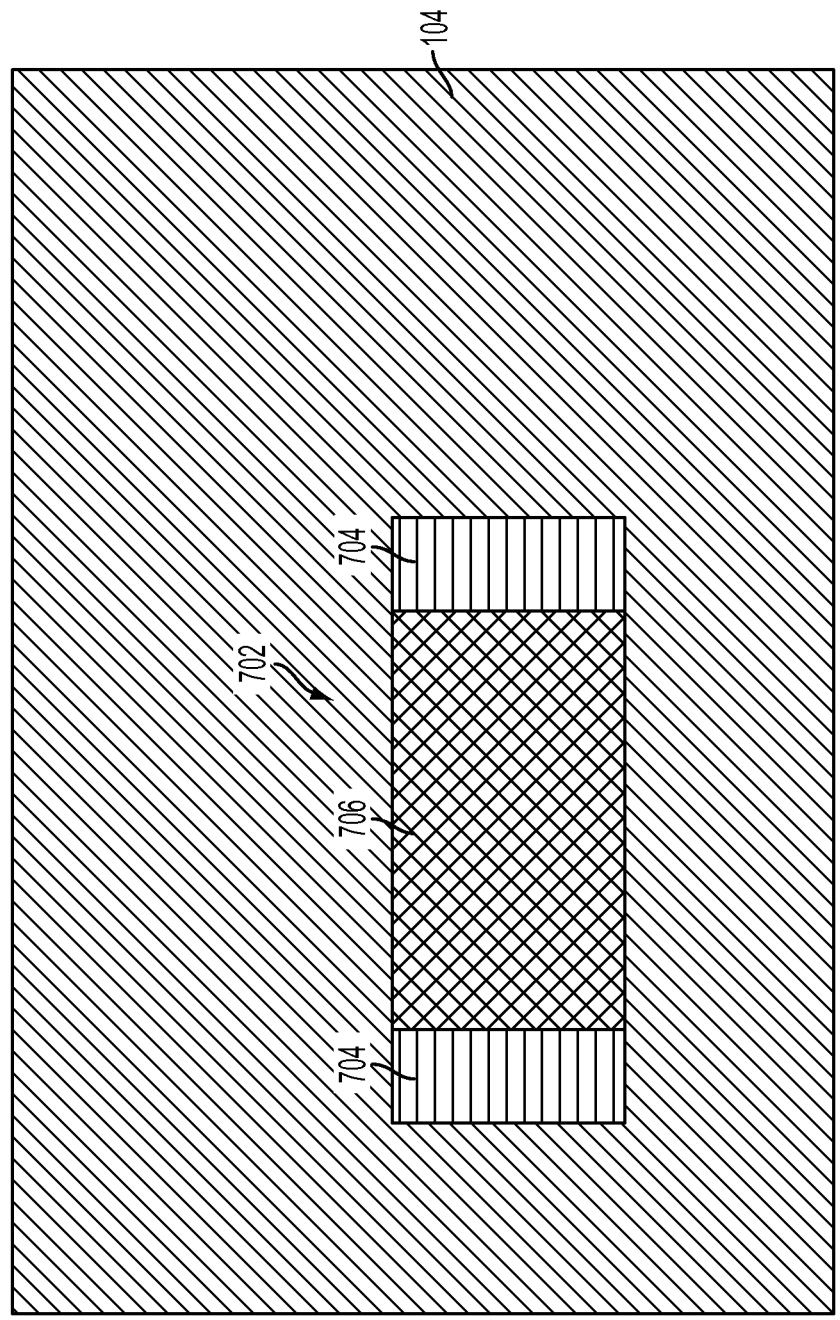
FIG. 8 illustrates a top view of the resistive device of FIG. 7.

FIG. 8 illustrates a top view of the resistive device 702 including the resistive body portion 706 and the conductive contact portions 704.

The illustrated methods and resultant device provide a method for forming a resistive device from a silicide material where the conductive layer 202 and the silicide layer 106 are self aligned.

The illustrated methods and resultant device provide a method for forming a resistive device from a silicide material while using an anisotropic dry etch for the conductive layer without an additional silicide protective dielectric film and special silicide contact mask and etch processes.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed, but that the invention will include all embodiments falling within the scope of the application.

What is claimed is:

1. A method for fabricating a device, the method comprising:
   forming a silicide layer on a substrate;
   forming a conductive layer over exposed portions of the substrate and the silicide layer;
   patterning and removing exposed portions of the conductive layer and the silicide layer with a first process; and
   patterning and removing exposed portions of the conductive layer with a second process, wherein removing exposed portions of the conductive layer with the second process includes a wet etching process that is substantially selective to the conductive layer.

2. The method of claim 1, wherein the removing exposed portions of the conductive layer and the silicide layer with the first process includes an anisotropic etching process.

3. The method of claim 2, wherein the anisotropic etching process includes a plasma etching process.

4. The method of claim 1, wherein the silicide layer is formed by:
   depositing a layer of silicide material on the substrate; and
   annealing the layer of silicide material.

5. The method of claim 1, wherein the silicide layer includes CrSi.

6. The method of claim 1, wherein the substrate includes an insulator layer, wherein the silicide layer is formed on the insulator layer.

7. The method of claim 1, wherein the conductive layer includes a metallic material.

8. A resistive device formed by the method of claim 1.

9. A method for fabricating a device, the method comprising:
   forming a silicide layer on a substrate;
   forming a conductive layer over exposed portions of the silicide layer;
   patterning a first mask material over a portion of the conductive layer;
   removing exposed portions of the conductive layer and the silicide layer with a first process;
   removing the first mask material;
   patterning a second mask material over a portion of the conductive layer; and
   removing exposed portions of the conductive layer with a second process, wherein removing exposed portions of the conductive layer with the second process includes a wet etching process that is substantially selective to the conductive layer.

10. The method of claim 9, wherein the removing exposed portions of the conductive layer and the silicide layer with the first process includes an anisotropic etching process.

11. The method of claim 10, wherein the anisotropic etching process includes a plasma etching process.

12. The method of claim 9, wherein the method further comprises removing the second mask material following the removal of the exposed portions of the conductive layer.

13. The method of claim 9, wherein the forming a conductive layer over exposed portions of the silicide layer includes forming the conductive layer over exposed features arranged on the substrate.

14. A resistive device formed by the method of claim 9.

* * * * *